United States Patent [19]

Babbitt et al.

[11] Patent Number: 4,930,133
[45] Date of Patent: May 29, 1990

[54] MULTIPLE LASER FREQUENCY STABILIZATION

[75] Inventors: William R. Babbitt, Bellevue; Raymond G. Beausoleil, Redmond; David A. Leep, Seattle, all of Wash.

[73] Assignee: The Boeing Company, Seattle, Wash.

[21] Appl. No.: 361,148

[22] Filed: Jun. 5, 1989

[51] Int. Cl.[5] .............................................. H01S 3/13
[52] U.S. Cl. ......................................... 372/32; 372/9; 372/18; 372/29; 372/97
[58] Field of Search .................... 372/9, 18, 29, 32, 92, 372/97

[56] References Cited

U.S. PATENT DOCUMENTS

| 3,967,211 | 6/1976 | Itzkan et al. | 331/94.5 S |
|---|---|---|---|
| 4,451,923 | 5/1984 | Hansch et al. | 372/32 |
| 4,468,773 | 8/1984 | Seaton | 372/32 |
| 4,583,228 | 4/1986 | Brown et al. | 372/32 |
| 4,677,630 | 6/1987 | Fujita et al. | 372/32 |
| 4,685,111 | 8/1987 | Baer | 372/18 |
| 4,719,635 | 1/1988 | Yeh | 372/50 |

FOREIGN PATENT DOCUMENTS

| 58-105785 | 3/1984 | Japan |
| 58-227292 | 6/1985 | Japan |
| 86/00553 | 3/1987 | PCT Int'l Appl. |

OTHER PUBLICATIONS

Dahmani et al., *Frequency Stabilization of Semiconductor Lasers by Resonant Optical Feedback*, Optics Letters, vol. 12, No. 11, pp. 876–878, Nov. 1987.
Bondarenko et al., *Stabilization of a Ruby Laser Using an He–Ne Laser as a Frequency Reference*, JETP Letters, vol. 22, No. 2, pp. 46–47, Jul. 20, 1975.
Tsuchida et al., *Frequency Stability Measurement of Feedback Stabilized AlGaAs DH Laser*, Japanese Journal of Applied Physics, vol. 19, No. 12, pp. L721–L724, Dec. 1980.

Primary Examiner—William L. Sikes
Assistant Examiner—Georgia Y. Epps
Attorney, Agent, or Firm—Christensen, O'Connor, Johnson & Kindness

[57] ABSTRACT

A system for producing two or more laser beams having stable frequency differences between them. The system includes two or more lasers that produce the respective laser beams, an optical resonator, and coupling optics for coupling portions of each laser beam into the resonator. The resonator produces feedback beams that are returned to the respective lasers to provide optical feedback. The feedback causes each laser to lock to a resonant mode of the resonator, to thereby stabilize the frequency difference between the lasers. The linewidth of each laser is also reduced.

12 Claims, 3 Drawing Sheets

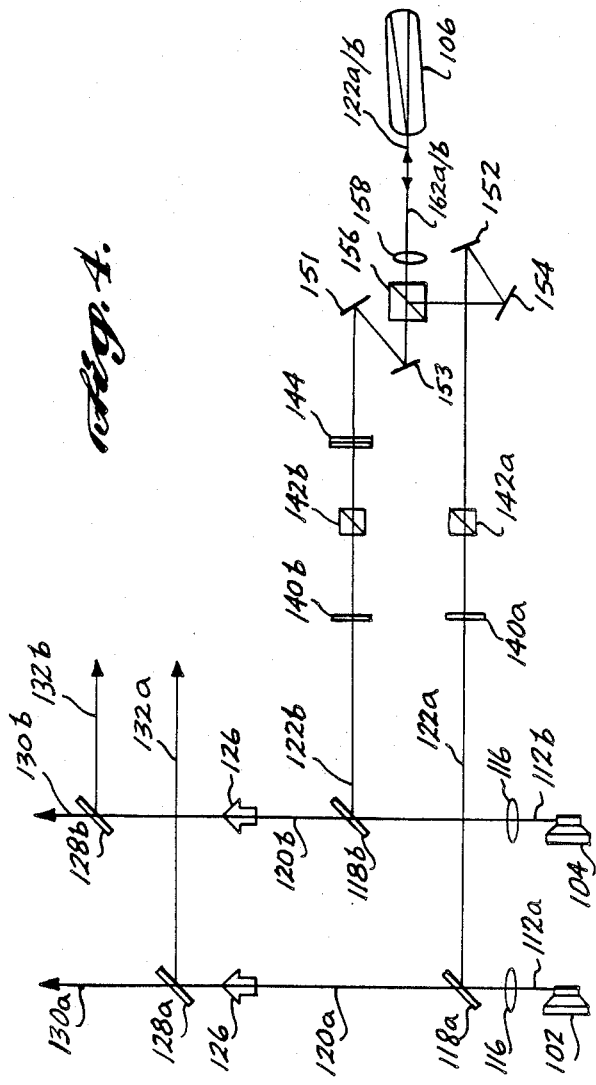
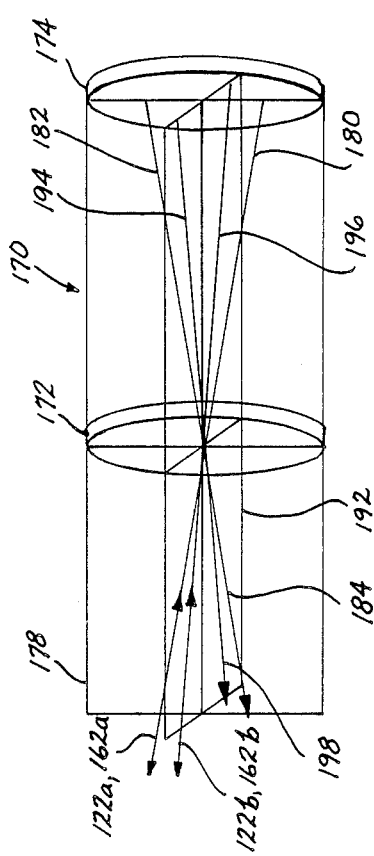

MULTIPLE LASER FREQUENCY STABILIZATION

FIELD OF THE INVENTION

The present invention relates to the frequency stabilization of lasers, and in particular, to a technique for producing a stable frequency difference between two or more lasers.

BACKGROUND OF THE INVENTION

Stabilization of the frequency difference between a pair of semiconductor lasers is an important goal in the development of optical communication systems. In the past, a number of techniques for achieving this goal have been proposed or attempted. In one prior technique, the output of a laser diode is modulated at a fixed frequency, thus producing multiple sidebands in the laser's power spectrum. The gain bandwidths of two "slave" lasers are individually tuned to overlap different ones of these sidebands, and the slave lasers are then injection locked to the respective sidebands. As a results, the frequency separation between the slave lasers is a multiple of the modulation frequency. A drawback of this technique is that the frequency stability is governed by the drift of the frequency of the master laser. In addition, the linewidths of the slave lasers will tend to be greater than or equal to that of the master laser. This latter phenomenon is due to the action of the sidebands of the master laser's power spectrum outside the slave laser's gain bandwidth, which action introduces noise and broadens the linewidth.

A second proposal for the frequency stabilization of semiconductor lasers is to use an acousto-optic modulator to frequency shift the laser output. The frequency separation between the shifted and unshifted beams is then fixed by the frequency used to drive the modulator. However, in order to achieve multi-gegahertz separations, it may be necessary to employ more than one acousto-optic modulator. In general, this approach is not economically competitive with other techniques for achieving the same end.

In both of the approaches discussed above, the frequency stability and the linewidth of each output beam are governed primarily by the master laser. Although this property can be altered by the addition of an electronic feedback network, the linewidths and/or spectral purity of the first two approaches will still suffer from the effects fo modulation of the master laser, incomplete spectral filtering, and noise from spurious inputs to the slave lasers. The frequency separation in both proposals would be dictated by the frequency of the RF source used to modulated the master laser drive the acousto-optic modulator.

A third prior approach for frequency stabilization is to have a slave laser which is locked to a fixed frequency separation from a master laser via electronic feedback. The electronic feedback system detects the beat signal of the interference of the outputs of the master and slave laser, compares it to a reference frequency, and then adjusts the current supplied to the slave laser to maintain a fixed frequency separation. The frequency stability is again dependent on the stability of the master laser.

All three proposals described above require stabilized RF electronics, along with the required optical components. In addition, a significant limitation of these proposals is that the frequency separation that can be obtained between the lasers is limited by the frequency available from the RF source, or from the relatively low order harmonics of the RF frequency. This requirement significantly limits the usefulness of these techniques in microwave and millimeter-wave applications.

SUMMARY OF THE INVENTION

The present invention provides a system for producing a stable frequency difference between two or more lasers. Unlike prior systems, the invention does not utilize electronic feedback, and does not require modulation of a laser beam. The invention has uses in optical communication, microwave/millimeter wave signal generation, optical position sensing, heterodyne detection systems, and in systems where it is necessary to reproduce laser sources whose frequencies have a fixed separation from a known standard.

In a preferred embodiment, the present invention provides a system for producing first and second laser beams having a stable frequency difference between them. The system comprises first and second lasers and an optical resonator. The first and second lasers include respective first and second output ports at which the first and second laser beams are produced, and first and second input ports at which optical feedback is provided. For many lasers, the output and input ports will be the same. The system further comprises coupling means for coupling light between the lasers and the optical resonator. The coupling means includes means for coupling portions of the first and second laser beams into the resonator such that the resonator produces first and second feedback beams, respectively, and means for coupling the first and second feedback beams into the respective first and second input ports. The optical feedback produced by this arrangement causes each laser to lock to a resonant mode of the optical resonator, thereby achieving the desired frequency stabilization between the laser.

The present invention has significant advantages with respect to prior techniques for frequency stabilizing two or more lasers. In particular, the invention can provide an essentially all optical system that does not require a stabilized radio frequency source. The frequency difference that can be obtained by the invention is therefore not limited by the frequency of an RF source, and the invention can thus be used in microwave and millimeter-wave applications. In a typical implementation, the only electronic components will be the current and temperature controller systems for the lasers and for the optical resonator, which systems are also necessary for the prior art systems discussed above. Commerical semiconductor lasers can in general be used without modification. The simplicity of the invention is illustrated by the fact that only three major components (two lasers and an optical resonator) are required to achieve frequency stability, fixed frequency separation, and linewidth reduction. The absence of frequency or amplitude modulation eliminates the noise introduced by spurious sidebands. The resonant optical feedback which locks the frequencies of the two lasers to the modes of the cavity also narrows the linewidths of the individual lasers far below the linewidths of the free running lasers. Linewidths of 20 kHz and lower can be achieved using unmodified commercially available semiconductor lasers. Although the invention does not necessarily fix the long term phase difference between the two laser beams, this is not a drawback for many applications.

BRIEF DESCRIPTION OF THE DRAWINGS

FIG. 4 is an optical schematic of a second preferred embodiment of system.

FIG. 5 is a schematic perspective view showing the use of separate spatial modes in the Fabry-Perot cavity.

DETAILED DESCRIPTIO OF THE INVENTION

Figure 1:
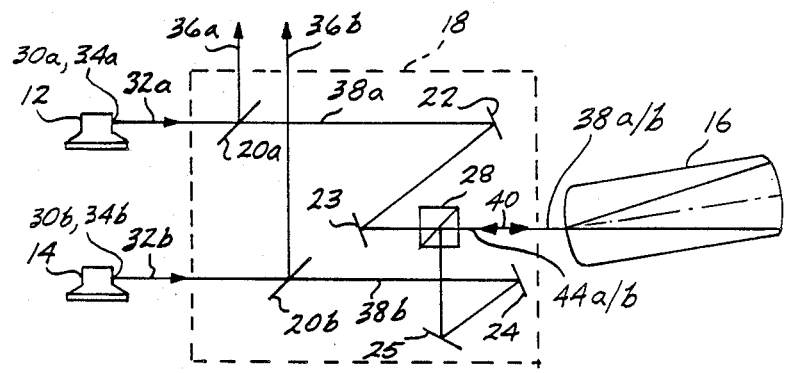
FIG. 1 is an optical schematic illustraing a first preferred embodiment of the frequency stabilization system of the present invention.

FIG. 1 schematically illustrates a first preferred embodiment of the frequency stabilization system of the present invention. The illustrated system includes semiconductor lasers 12 and 14, optical resonator 16 and coupling optics 18. The coupling optics comprises beamsplitters 20a and 20b, mirrors 22-25, and beamsplitter 28. Lasers 12 and 14 include respective output ports 30a and 30b at which laser beams 32a and 32b are produced. The lasers also include input ports 34a and 34b at which the lasers can receive optical feedback. For the embodiment illustrated in FIG. 1, the input and output port of each laser are coincident with one another. Laser beams 32a and 32b are divided by beamsplitters 20a and 20b into output beams 36a and 36b and sample beams 38a and 38b. Mirrors 22-25 and beamsplitter 28 couple sample beams 38a and 38b into resonator 16 along a common optical path 40.

The resonator responds to the sample beams by producing a corresponding pair of feedback beams 44a and 44b. The resonator is oriented with respect to the sample beams such that the feedback beams are produced along optical path 40, traveling in a direction opposite to that of the sample beams. Thus feedback beams 44a and 44b retrace the paths of respective sample beams 38a and 38b back to input ports 34a and 34b of lasers 12 and 14, to provide optical feedback to the lasers. Because feedback beams of significant intensity are produced only at frequencies that correspond to resonant modes of resonator 16, the result of the optical feedback is to stabilize the operating frequency of each laser at a particular resonant frequency, as further described below.

Figure 2:
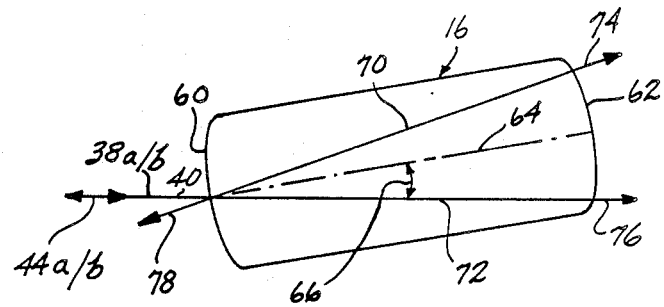
FIG. 2 is a schematic view of the Fabry-Perot cavity.

Referring now to FIGS. 1 and 2, in the illustrated preferred embodiment, resonator 16 comprises a confocal Fabry-Perot cavity having a pair of spherically curved end faces 60 and 62, and a central axis 64 along which the end faces are spaced by a distance equal to their common radius of curvature. Sample beams 38a and 38b are introduced into resonator 16 at the center of face 60, inclined at an angle 66 with respect to central axis 64. The result is a V mode of operation in which the light within resonator 16 reflects back and forth between faces 60 and 62 along paths 70 and 72. In general, for such a mode, a total of four pairs of output beams may be produced. In addition to feedback beams 44 that retrace the path of sample beams 38, the possible output beams include beam pairs 74 and 76 that may be emitted from face 62, and beam pair 78 produced at face 60. Feedback beams 44 and beam pairs 74 and 76 all comprise light that has been transmitted one or more times through the resonator, whereas each beam of beam pair 78 includes both transmitted light and light that reflects directly from face 60 without entering the resonator. Beams 44, 74, and 76 will therefore be referred to as "transmitted" beams, or beams "transmitted" by the resonator. In the illustrated embodiment, the resonator is positioned with respect to sample beams 38 such that feedback beams 44 retrace the path of the sample beams along common optical path 40. Arrangements in which transmitted beams 74 or 76 form the feedback beam can also be used.

A given resonator, for example a given Fabry-Perot cavity, will typically have a large set of orthogonal modes that can be used to produce the feedback beams. In general, any higher order mode can be used, i.e., any mode other than the mode in which the sample beams are coupled into the resonator at and parallel to central axis 64. By way of further example, one could use a mode in which the sample beams are introduced into the resonator parallel to axis 64, but displaced laterally therefrom. The basic requirement is that the feedback beams should not include any components that have been reflected directly from the resonator, or that otherwise have not been transmitted through the resonator and thereby subjected to the frequency selection action of the resonator. Any suitable mode matching means may be used to couple the sample beams into the resonator, to avoid plural spatial modes within the resonator. For example, the sample beams may be focused such that they have a waist at the center of the resonator.

Figure 3:
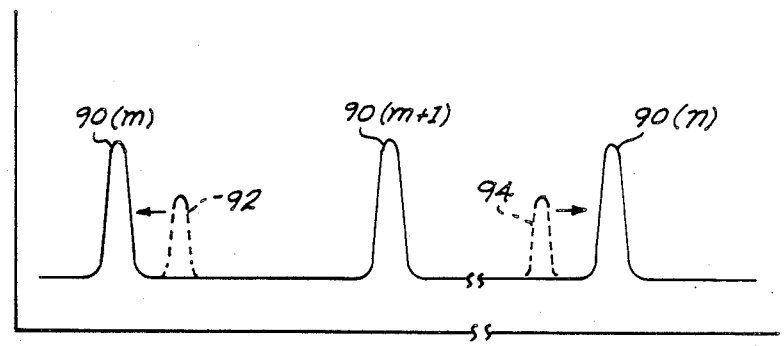
FIG. 3 is a graph illustrating the relationship between laser spectra and cavity resonance modes.

FIG. 3 presents a graph (solid line) schematically showing the transmission of an optical resonator as a function of frequency. The graph includes a series of equally spaced peaks 90 (m), each peak corresponding to a different longitudinal mode of the resonator. In particular, the center frequency $f_m$ of each peak 90 (m) is given by $$f_m = \frac{cm}{2nL}$$

where c is the speed of light, m is the mode number, n is the index of refraction of the interior of the resonator, and L is the length of the resonator along central axis 64. For the system illustrated in FIGS. 1-2, there would be a factor of 4 rather than 2 in the denominator, because in the V mode of operation, the total internal physical path length is equal to 4L. The spacing between adjacent peaks is referred to as the free spectral range (FSR).

FIG. 3 also illustrates a frequency spectrum 92 for laser 12, and a frequency spectrum 94 for laser 14. The spectra are assumed to be the free running spectra of the lasers, i.e., without optical feedback. The optical feedback provided by the present invention causes each laser to lock to an adjacent longitudinal mode of resonator 16, provided that the longitudinal mode was initially within the lock range of that laser, the lock range being in general a function of the feedback power ratio. Thus, as indicated by the arrows in FIG. 3, the frequency of laser beam 30a produced by laser 12 shifts downward and locks longitudinal mode 90 (m), while the frequency of laser beam 30b produced by laser 14 shifts upward and locks to longitudinal mode 90 (n). Thus the center frequency separation between the lasers will be a multiple of the free spectral range of resonator 16. Typical values for the free spectral range of commercially available resonators vary from approximately 100 MHz to 1 THz.

By reason of the mode locking described above, the frequency difference between lasers 12 and 14 is stabilized by optical feedback alone, without the use of electronic feedback systems, and without the need for modulating the output of either laser. As a further advantage, the locking caused by the resonant optical feedback significantly narrows the linewidth of each laser, to values as low as 20 kHz or less. The linewidth will be reduced by a factor proportional to the ratio of the photon lifetime of the laser cavity to that of the resonator.

Output beams 36a and 36b produced by the present invention can be heterodyned with one another, to produce an optical signal having a frequency equal to a multiple of the free spectral range of the optical resonator. As a result of the frequency stabilization provided by the invention, the drift in the optical heterodyne frequency due to changes in the optical path length of the optical resonator is greatly reduced. By adjusting the current and/or temperature of either laser, microwave and even millimeter-wave heterodyne frequencies can be generated which are well defined, narrow band, and stable multiples of the resonator's free spectral range. Thus, multiple semiconductor lasers can be locked to different modes of the resonator, and frequency division multiplexed onto a single optical communication link. The multiplexed information can be demultiplexed at the receiver end by optically heterodyning the transmitted signal with the output of a receiver consisting of an identical system of optically stabilized lasers. Since the separation between individual channels can be any multiple of the free spectral range of the resonator, complete and flexible control over the channel bandwidths is provided.

In general, it is necessary to insure that each laser is responding only to the optical feedback produced by the resonator in response to the sample beam from the laser. This goal can be achieved in a number of ways. In the simplest approach, lasers 12 and 14 are selected such that their gain bandwidths do not overlap. Thus light originating in laser 12 that is returned to laser 14 does not affect the operation of laser 14, and vice versa. Other techniques for avoiding crosstalk of this type include polarization of the respective sample beams, and/or the use of separate modes within resonator 16, as further described below.

A second preferred embodiment of the system of the present invention is set forth in FIG. 4. The system includes lasers 102 and 104, and confocal Fabry-Perot cavity 106. Lasers 102 and 104 produce respective laser beams 112a and 112b that are collimated by lenses 116 and then divided by beamsplitters 118a and 118b into respective main beams 120a and 120b and sample beams 122a and 122b. Main beams 120 pass through optical isolators 126, and are incident onto a second pair of beamsplitters 128a and 128b that divide the main beams into output beams 130a and 130b and test beasm 132a and 132b. The test beams may be coupled to a suitable diagnostic system. Optical isolators 126 serve to prevent optical feedback into the lasers along the paths followed by main beams 120, to insure that the optical feedback reaching the lasers comes predominantly from cavity 106. Two or more optical isolators may be used in series to increase the degree of isolation.

Sample beams 122a and 122b pass through variable attenuators 140a and 140b and polarizers 142a and 142b. The polarizers insure that the sample beams have the identical state of polarization. For cases in which the polarizations of the same beams are known from the characteristics of the lasers, polarizers 142 may be unnecessary. Sample beam 122b then also passes through half wave plate 144 that rotates the polarization of sample beam 122b by 90 degrees, so that sample beams 122a and 122b thereafter have orthogonal polarizations with respect to one another. The sample beams are coupled into cavity 106 by fixed mirrors 151 and 152, PZT controlled mirrors 153 and 154, polarizing beamsplitter cube 156, and lens 158. As described above in connection with the embodiment of FIGS. 1-2, cavity 106 responds to the sample beams by producing a corresponding pair of feedback beams 162a and 162b that retrace the paths of the sample beams back to lasers 102 and 104 respectively, to provide optical feedback.

Polarizers 142 and half wave plate 144 insure that there is not crosstalk between the feedback beams returned from cavity 106. For example, for the sake of illustration, assume that the sample beams emerging from polarizers 142a and 142b polarized in a horizontal plane. Half wave plate 144 then converts sample beam 122b to vertical polarization. Thereafter, any horizontally polarized light returned by the cavity as part of feedback beam 162b will be converted to vertical polarization by half wave plate 144, and this vertically polarized component will then be blocked by polarizer 142b so that it does not reach laser 104. Crosstalk between these optical feedbacks to the two lasers is thereby prevented.

Variable attenuators 140 may be used to adjust the strength of the optical feedback. In general, if feedback is too low, the lasers will not lock to the cavity resonance modes, while if the feedback is too high, instability may result, with the laser frequencies jumping back and forth between different modes. Typical feedback power ratios are $10^{-4}$ to $10^{-5}$. PZT mirrors 153 and 154 are used to control the optical path lengths between each laser and cavity 106. Control of such optical paths is desirable because the combination of each laser and cavity 106 in itself forms a "system" cavity. For most effective operation, a resonant mode of the system cavity should be coincident with the resonant mode of cavity 106.

FIG. 5 illustrates another technique for preventing crosstalk between the feedback paths. This figure illustrates confocal Fabry-Perot cavity 170 comprising reflective end faces 172 and 174. Sample beam 122a from laser 102 enters cavity 170 in a plane of incidence 178 that is vertical in FIG. 5. Thus light from laser 102 follows paths 180 and 182 within the cavity, and produces feedback beam 162a that retraces the path of sample beam 122a, as well as an unused beam 184 that includes light reflected directly from face 172. Sample beam 122b from laser 104 enters the cavity in horizontal plane of incidence 188. This light follows paths 194 and 196 within the cavity, and produces feedback beam 162b and unused beam 198. Thus in this arrangement, crosstalk is prevented by the use of separate spatial mdes within cavity 170, and polarization control is generally not required. This approach is particularly suitable for systems in which three or more lasers are locked to a common optical resonator.

Figure 6:
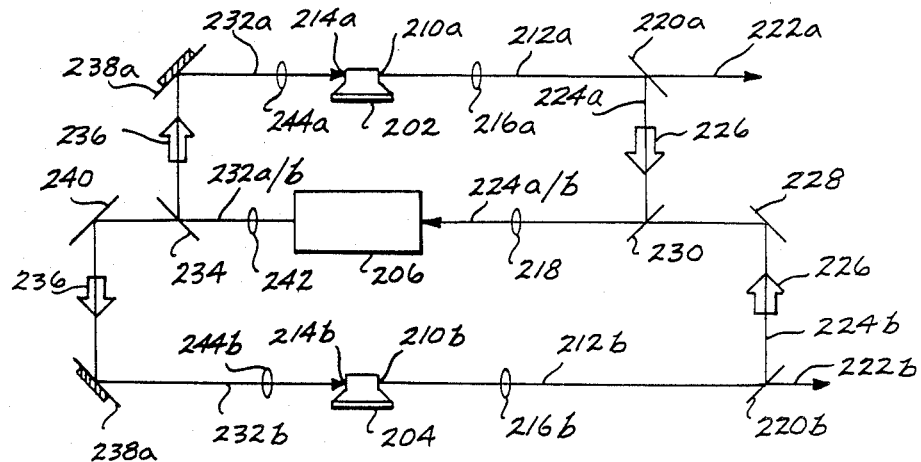
FIG. 6 is an optical schematic of a third preferred embodiment of the system.

A third preferred embodiment of the system of the present invention is set forth in FIG. 6. The system includes semiconductor lasers 202 and 204 and optical resonator 206. Lasers 202 and 204 include respective output ports 210a and 210b at which laser beams 212a and 212b are produced, and input ports 214a and 214b at which optical feedback is provided. For each laser, its input and output ports are at opposite ends of the laser cavity. Laser beams 212a and 212b strike respective beamsplitters 220a and 220b via lenses 216a and 216b, the beamsplitters dividing the laser beams into output beams 222a and 222b and sample beams 224a and 224b. The sample beams pass through optical isolators 226, sample beam 224b is reflected by mirror 228, and the sample beams are then combined by beamsplitter 230 and directed into resonator 206 via lens 218.

Resonator 206 responds to the sample beams by producing feedback beams 232a and 232b at the opposite end of the resonator. The feedback beams pass through lens 242, and feedback beam 232a is coupled to input port 214a via beamsplitter 234, PZT controlled mirror 238a, and lens 244a, while feedback beam 232b is coupled to input port 214b via beamsplitter 234, mirro 240, PZT controlled mirror 238a, and lens 244b. For both feedback beams, optical isolators 236 prevent passage of light in the opposite directions. Any of the techniques discussed previously (e.g. separate gain bandwidths, orthogonal polarizations or different spatial modes) may be used to prevent crosstalk between the lasers. In the system of FIG. 6, the feedback beams are taken from the opposite end of resonator 206, with respect to the sample beams, and this arrangement is therefore analogous to the use of beams 74 or 76 in the arrangement shown in FIG. 2. However in the FIG. 6 system, the presence of optical isolators 226 permits the use of a straight-through mode, in which the light travels along the central axis of the resonator.

While the preferred embodiments of the invention have been illustrated and described, variations will be apparent to those skilled in the art. Accordingly, the scope of the invention is to be determined by reference to the following claims.

The embodiments of the invention in which an exclusive property or privilege is claimed are defined as follows:

1. A system for producing first and second laser beams having a stable frequency difference therebetween, the system comprising:
    a first laser including a first optical input port, a first optical output port and means for producing the first laser beam at the first optical output port;
    a second laser including a second optical input port, a second optical output port, and means for producing the second laser beam at the second optical output port;
    an optical resonator; and,
    coupling means including means for coupling portions of the first and second laser beams into the resonator such that the resonator produces first and second optical feedback beams, respectively, means for coupling the first optical feedback beam into the first input port, and means for coupling the second optical feedback into the second input port;
    whereby the optical resonator provides optical feedback to each laser such that each laser locks to a resonant mode of the optical resonator.

2. The system of claim 1, wherein the coupling means comprises first and second beamsplitters for dividing the first and second laser beams into respective first and second main beams and first and second sample beams, and means for coupling the first and second sample beams into the optical resonator.

3. The system of claim 2, wherein the first and second sample beams are coupled into the resonator along first and second optical paths respectively, wherein for each laser, the input and output ports are coincident with one another, and wherein the first and second feedback beams are coupled from the resonator to the input ports along the first and second optical paths respectively, whereby the feedback beams retrace the paths of the sample beams.

4. The system of claim 3, wherein the coupling means further comprises optical path adjustment means for varying the optical path lengths of the first and second optical paths.

5. The system of claim 2, wherein the coupling means comprises polarizing means for causing the first and second sample beams to have different polarizations from one another within the optical resonator.

6. The system of claim 2, wherein the first and second sample beams are coupled into the resonator in different spatial modes.

7. The system of claim 1, wherein the optical resonator comprises a Fabry-Perot cavity.

8. The system of claim 7, wherein the Fabry-Perot cavity comprises first and second concave faces positioned to form a confocal cavity between them.

9. The system of claim 8, wherein the first and second sample beams are coupled into the Fabry-Perot cavity at a center of the first face, inclined at an angle with respect to a line drawn from said center to a center of the second face.

10. The system of claim 2, wherein for each laser, the input port is not coincident with the output port, and the sample beam travels from the laser to the optical resonator along a sample path and from the optical resonator to the input port along a feedback path.

11. The system of claim 10, further comprising an optical isolator in each sample path for preventing return of light of the output port of the laser along the sample path.

12. The system of claim 10, wherein the coupling means further comprises optical path adjustment means for varying the optical path length of the feedback path of each laser.

* * * * *

UNITED STATES PATENT AND TRADEMARK OFFICE
CERTIFICATE OF CORRECTION

PATENT NO. : 4,930,133

DATED : May 29, 1990

INVENTOR(S) : W. R. Babbitt et al.

It is certified that error appears in the above-identified patent and that said Letters Patent is hereby corrected as shown below:

| Column | Line | |
|---|---|---|
| 1 | 22, 23 | "re-sults" should be --result-- |
| 2 | 53 | "Commerical" should be --Commercial-- |
| 3 | 5 | "illustraing" should be --illustrating-- |
| 3 | 12 | after "of" insert --the-- |
| 3 | 18 | "DESCRIPTIO" should be --DESCRIPTION-- |
| 5 | 59 | "beasm" should be --beams-- |
| 6 | 3 | "same" should be --sample-- |
| 6 | 61 | "mdes" should be --modes-- |
| 7 | 19 | "mirro" should be --mirror-- |
| 7 | 46 | "port" should be --port,-- |
| 8 | 3 | after "feedback" insert --beam-- |
| 8 | 44 | "port,." should be --port,-- |

Signed and Sealed this

Eighth Day of October, 1991

Attest:

HARRY F. MANBECK, JR.

*Attesting Officer*     *Commissioner of Patents and Trademarks*